United States Patent
Wang

(10) Patent No.: US 12,349,337 B2
(45) Date of Patent: Jul. 1, 2025

(54) MEMORY STRUCTURE AND METHOD OF MANUFACTURING THE SAME

(71) Applicant: NANYA TECHNOLOGY CORPORATION, New Taipei (TW)

(72) Inventor: Wei-Chih Wang, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 486 days.

(21) Appl. No.: 17/804,095

(22) Filed: May 25, 2022

(65) Prior Publication Data
US 2023/0389292 A1 Nov. 30, 2023

(51) Int. Cl.
*H10B 12/00* (2023.01)

(52) U.S. Cl.
CPC .......... *H10B 12/34* (2023.02); *H10B 12/053* (2023.02)

(58) Field of Classification Search
CPC .. H10B 12/34; H10B 12/0335; H10B 12/053; H10B 12/315; H10B 12/485
See application file for complete search history.

(56) References Cited

U.S. PATENT DOCUMENTS

2022/0122986 A1* 4/2022 Jang .................... H10B 12/053

* cited by examiner

*Primary Examiner* — Meiya Li
(74) *Attorney, Agent, or Firm* — CKC & Partners Co., LLC

(57) ABSTRACT

A memory structure of the present disclosure includes a source/drain region on a substrate, a first dielectric layer covering the source/drain region, a second dielectric layer on the first dielectric layer, and a contact contacting the source/drain region. The contact includes a first contact portion extending into the source/drain region, a second contact portion extending into the first dielectric layer, and a third contact portion extending into the second dielectric layer. A bottom surface of the first contact portion is lower than a top surface of the source/drain region. The second contact portion is between the first contact portion and the third contact portion. A distance between a sidewall of the first contact portion and a sidewall of the source/drain region is 30% to 60% of a width of the source/drain region.

16 Claims, 13 Drawing Sheets

MEMORY STRUCTURE AND METHOD OF MANUFACTURING THE SAME

BACKGROUND

Field of Invention

The present disclosure relates to the memory structure and its manufacturing method. More particularly, the present disclosure relates to the contact of the memory structure.

Description of Related Art

Memory devices, such as dynamic random access memory (DRAM), static random access memory (SRAM), or the like, are used in a variety of electronic applications. The memory industry continues to improve the integration density of various electronic components (e.g., transistors, resistors, capacitors, etc.) by continual reductions in minimum feature size, which allow more components to be integrated into a given area. However, the reduced feature size also decreases the contact area between the electronic components, which may disadvantageously affect the function of the memory device.

SUMMARY

According to some embodiments of the present disclosure, a memory structure includes a source/drain region on a substrate, a first dielectric layer covering the source/drain region, a second dielectric layer on the first dielectric layer, and a contact contacting the source/drain region. The contact includes a first contact portion extending into the source/drain region, a second contact portion extending into the first dielectric layer, and a third contact portion extending into the second dielectric layer. A bottom surface of the first contact portion is lower than a top surface of the source/drain region. The second contact portion is between the first contact portion and the third contact portion. A distance between a sidewall of the first contact portion and a sidewall of the source/drain region is 30% to 60% of a width of the source/drain region.

In some embodiments, a bottom surface of the second contact portion is lower than the bottom surface of the first contact portion.

In some embodiments, a bottom surface of the second contact portion is coplanar with the bottom surface of the first contact portion.

In some embodiments, a bottom surface of the third contact portion is higher than the bottom surface of the first contact portion and a bottom surface of the second contact portion.

In some embodiments, a bottom surface of the third contact portion is coplanar with the top surface of the source/drain region.

In some embodiments, an interface between the second contact portion and the third contact portion is coplanar with a sidewall of the first dielectric layer.

In some embodiments, a width of the second contact portion is the same as a width of the first dielectric layer on the sidewall of the source/drain region.

In some embodiments, a width of the second contact portion is larger than a width of the first dielectric layer on the sidewall of the source/drain region.

In some embodiments, the first dielectric layer is an oxide layer, and the second dielectric layer is a nitride layer.

According to some embodiments of the present disclosure, a memory structure includes a substrate including a digit region and a cell region, a first source/drain region on the substrate in the digit region, a second source/drain region on the substrate in the cell region, a first dielectric layer covering the first source/drain region and the second source/drain region, a second dielectric layer on the first dielectric layer, a digit contact contacting the first source/drain region, and a cell contact contacting the second source/drain region. The digit contact includes a first digit contact portion extending into the first source/drain region, a second digit contact portion extending into the first dielectric layer on a sidewall of the first source/drain region, and a third digit contact portion extending into the second dielectric layer. A bottom surface of the first digit contact portion is lower than a top surface of the first source/drain region. The second digit contact portion is between the first digit contact portion and the third digit contact portion. A distance between a sidewall of the first digit contact portion and another sidewall of the first source/drain region is 30% to 60% of a width of the first source/drain region.

In some embodiments, the cell contact includes a first cell contact portion extending into the second source/drain region, a second cell contact portion extending into the first dielectric layer on a sidewall of the second source/drain region and the second source/drain region, and a third cell contact portion extending into the second dielectric layer. A bottom surface of the first cell contact portion is lower than a top surface of the second source/drain region. The second cell contact portion is between the first cell contact portion and the third cell contact portion. A distance between a sidewall of the first cell contact portion and another sidewall of the second source/drain region is 30% to 60% of a width of the second source/drain region.

In some embodiments, the bottom surface of the first digit contact portion is lower than the bottom surface of the first cell contact portion.

In some embodiments, a bottom surface of the second digit contact portion is coplanar with a bottom surface of the second cell contact portion.

In some embodiments, a bottom surface of the third digit contact portion is coplanar with a bottom surface of the third cell contact portion and the top surface of the first source/drain region.

In some embodiments, a width of the third digit contact portion is 30% to 60% of a distance between the first dielectric layer on the sidewall of the first source/drain region and the first dielectric layer on the sidewall of the second source/drain region.

In some embodiments, a width of the second cell contact portion is larger than a width of the second digit contact portion.

According to some embodiments of the present disclosure, a method of manufacturing a memory structure includes the following steps. A first dielectric layer is formed on a source/drain region, and a second dielectric layer is formed on the first dielectric layer. A mask layer is formed on the second dielectric layer, in which the mask layer includes a mask opening exposing the second dielectric layer, and a distance between a sidewall of the mask opening and a sidewall of the source/drain region is 30% to 60% of a width of the source/drain region. The second dielectric layer and the first dielectric layer are etched through the mask opening to form a first opening, in which the first opening exposes a top surface and another sidewall of the source/drain region. The source/drain region is etched through the first opening to form a second opening. The second opening is filled with a conductive material to form a contact.

In some embodiments, a bottom surface of the second opening includes a first portion exposing the source/drain region, a second portion exposing the first dielectric layer, and a third portion exposing the second dielectric layer. The second portion is lower than the first portion, and the first portion is lower than the third portion.

In some embodiments, the second portion further exposes the source/drain region.

In some embodiments, a bottom surface of the second opening includes a first portion exposing the source/drain region, a second portion exposing the first dielectric layer, and a third portion exposing the second dielectric layer. The second portion is coplanar with the first portion, and the second portion is lower than the third portion.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows. Aspects of the present disclosure are best understood from the following detailed description when read with the accompanying figures. It is noted that, in accordance with the standard practice in the industry, various features are not drawn to scale.

DETAILED DESCRIPTION

Figure 1:
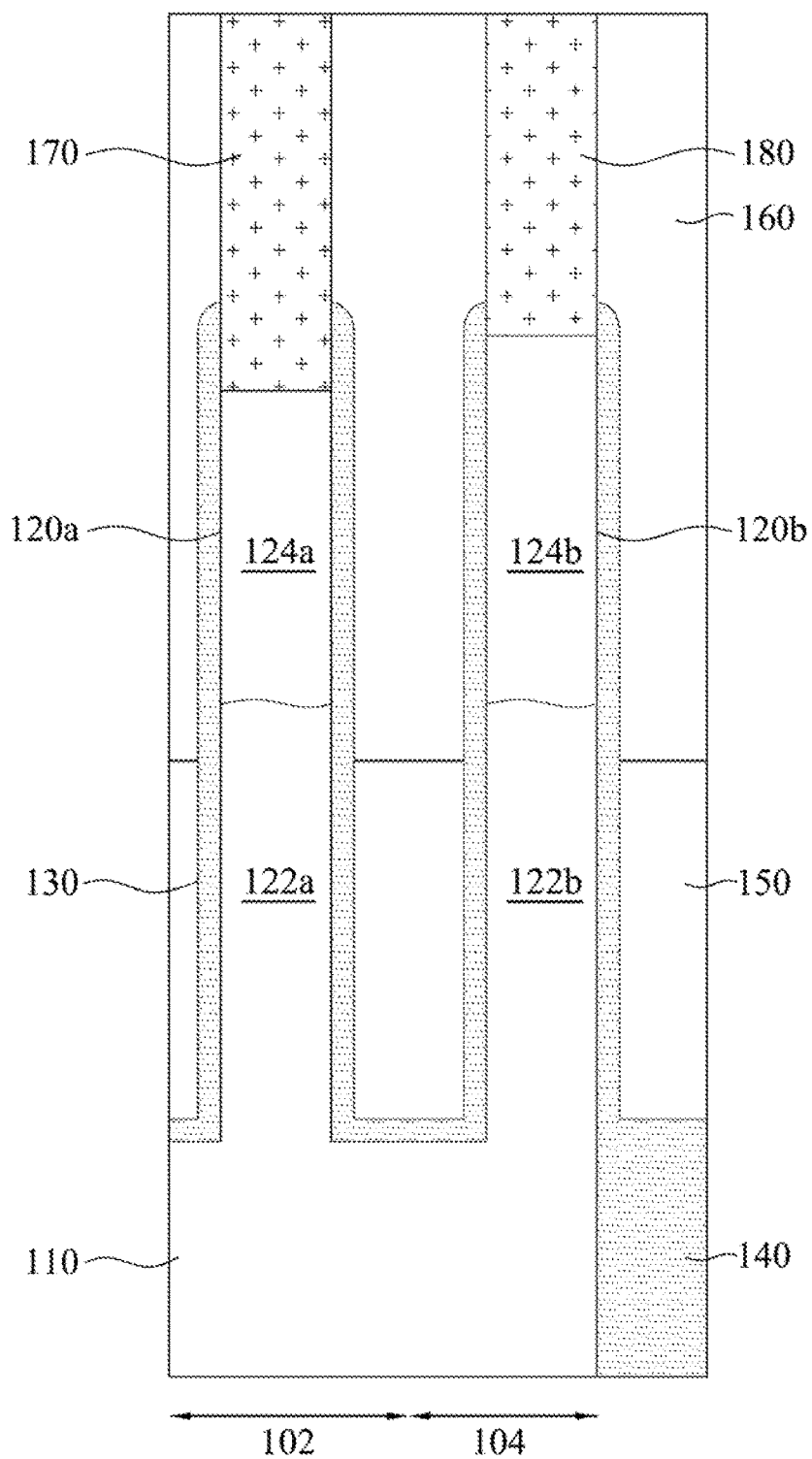
FIG. 1 illustrates a cross-sectional view of a memory structure according to a comparative example of the present disclosure.

The following disclosure provides many different embodiments, or examples, for implementing different features of the provided subject matter. Specific examples of components, values, arrangements, etc., are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, reference will now be made in detail to the present embodiments of the disclosure, examples of which are illustrated in the accompanying drawings. Wherever possible, the same reference numbers are used in the drawings and the description to refer to the same or like parts.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure provides a memory structure and its manufacturing method. The memory structure includes a first dielectric layer covering a source/drain region, a second dielectric layer on the first dielectric layer, and a contact contacting the source/drain region. A first contact portion of the contact extends into the source/drain region, a second contact portion extends into the first dielectric layer, and a third contact portion extends into the second dielectric layer. Since a sidewall of the first contact portion is separated from a sidewall of the source/drain region by a distance, the contact area between the contact and the source/drain region is increased. Therefore, the electric resistance between the contact and the source/drain region is reduced, which improves the efficiency of the memory structure.

FIG. 1 illustrates a cross-sectional view of a memory structure 100 according to a comparative example of the present disclosure. The memory structure 100 includes a substrate 110, a first source/drain region 124a and a second source/drain region 124b on the substrate 110, a first dielectric layer 130 covering the first source/drain region 124a and second source/drain region 124b, a gate structure 150 above the substrate 110, a second dielectric layer 160 on the first dielectric layer 130 and the gate structure 150, a first contact 170 contacting the first source/drain region 124a through the first dielectric layer 130, and a second contact 180 contacting the second source/drain region 124b through the first dielectric layer 130.

Specifically, the substrate 110 includes a digit region 102 and a cell region 104. A fin 120a is protruded from the substrate 110 in the digit region 102. The fin 120a includes a bottom portion 122a and the first source/drain region 124a on the bottom portion 122a. In some embodiments, the fin 120a includes the same bulk material as the substrate 110, and the upper portion of the fin 120a is dopes to form the first source/drain region 124a. Similarly, a fin 120b is protruded from the substrate 110 in the digit region 102. The fin 120b includes a bottom portion 122b and the second source/drain region 124b on the bottom portion 122b.

In some embodiments, the digit region 102 and the cell region 104 may collectively form a memory cell (or referred as an active region) of the memory structure 100. As shown in FIG. 1, an isolation structure 140 is positioned adjacent to the cell region 104 to separate the cell region 104 from another memory cell (not shown). The first source/drain region 124a in the digit region 102 may act as a drain region, while the second source/drain region 124b in the cell region 104 act as a source region. As a result, the first contact 170 may be referred as a drain contact or a digit contact, and the second contact 180 may be referred as a source contact or a cell contact. It is noted that the sidewalls of the first source/drain region 124a and the second source/drain region 124b are respectively coplanar with those of the first contact 170 and the second contact 180. In other words, the top surfaces of the first source/drain region 124a and the second source/drain region 124b are fully covered by the bottom surfaces of the first contact 170 and the second contact 180.

Figure 2A:
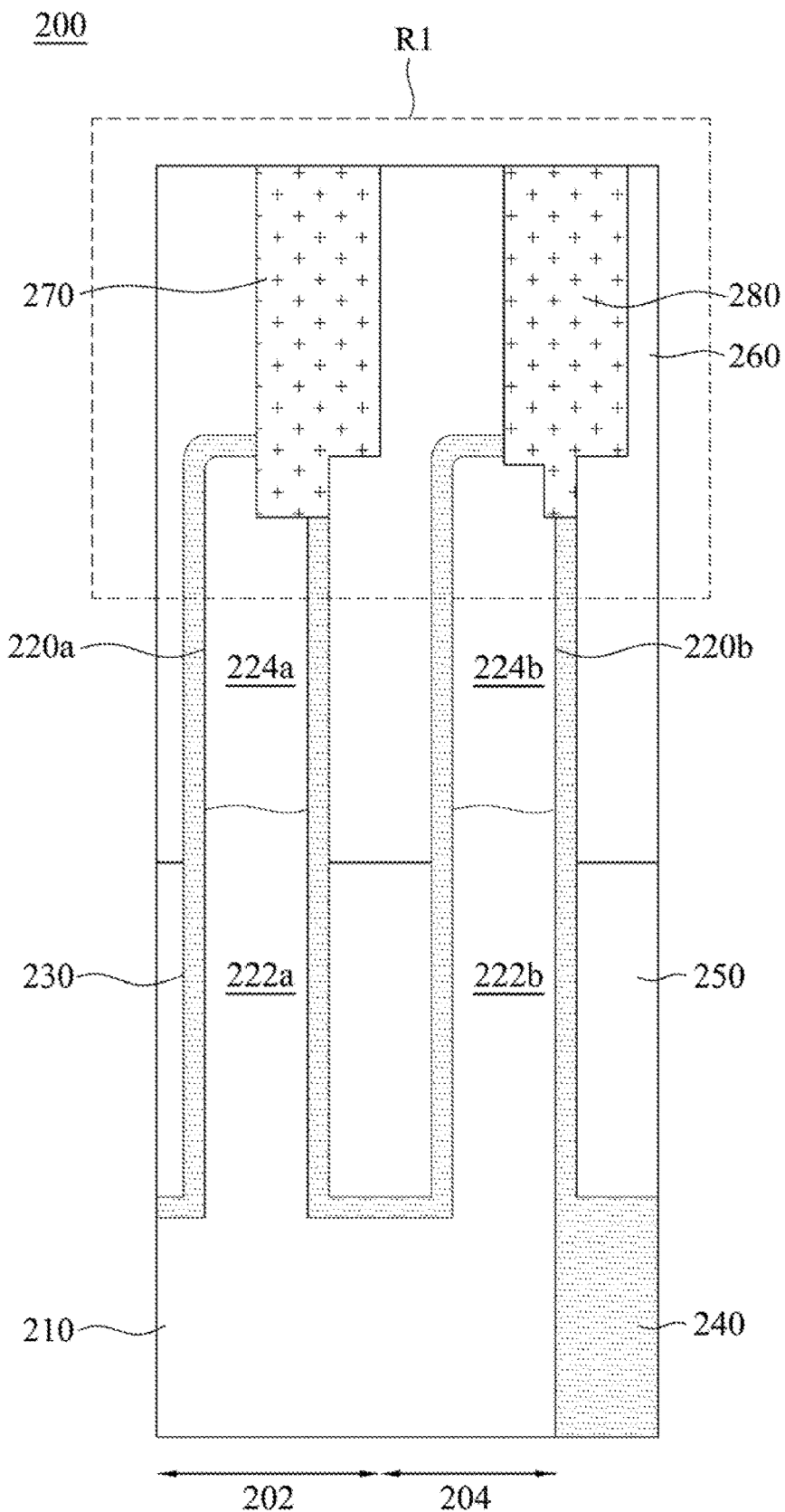
FIG. 2A illustrates a cross-sectional view of a memory structure according to an embodiment of the present disclosure.
Figure 2B:
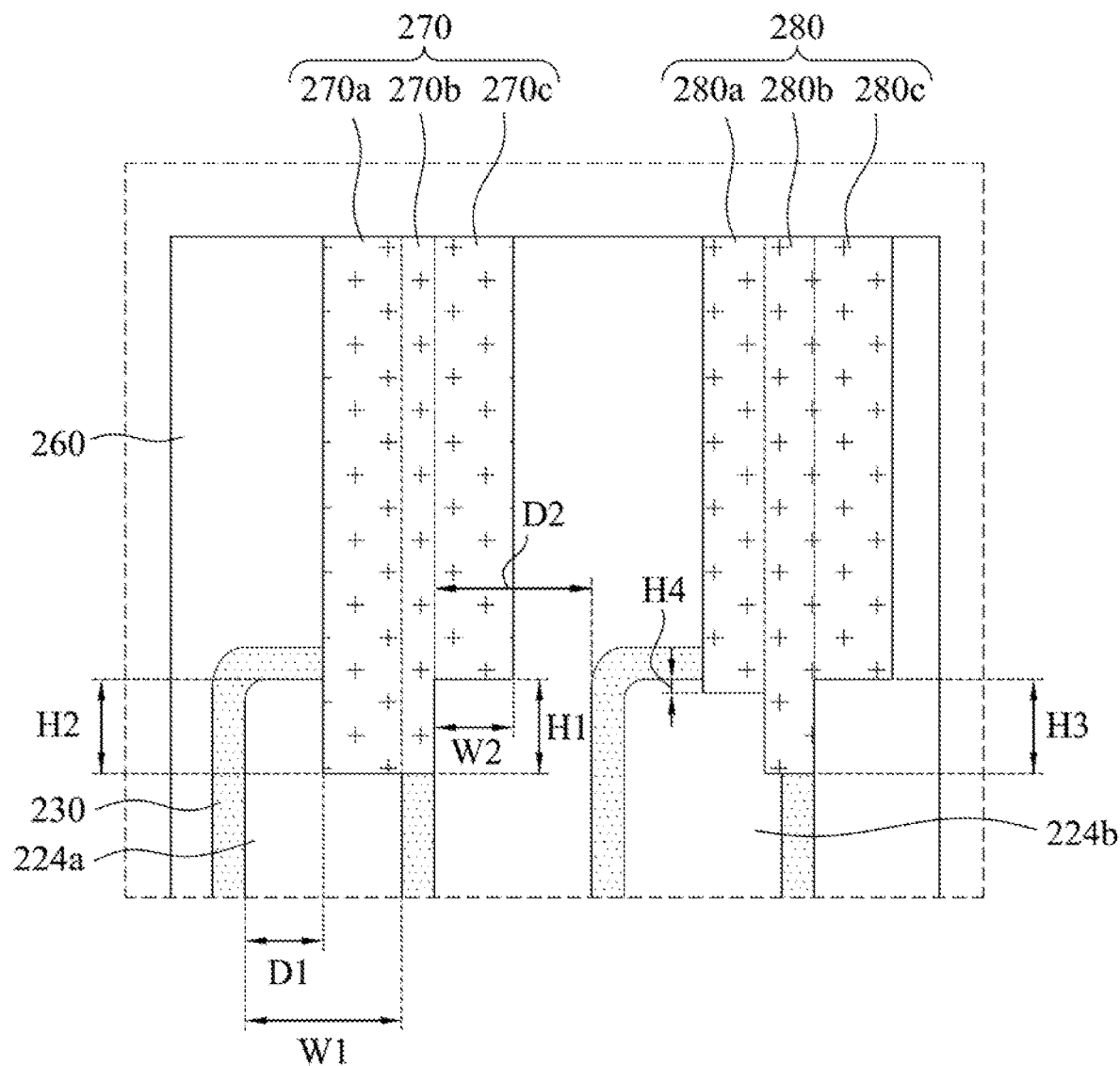
FIG. 2B illustrates an enlarged view of the memory structure shown in FIG. 2A.

FIG. 2A illustrates a cross-sectional view of a memory structure 200 according to an embodiment of the present disclosure. FIG. 2B illustrates an enlarged view of a region R1 of the memory structure 200 shown in FIG. 2A. The memory structure 200 is similar to the memory structure 100 shown in FIG. 1, except for the design of the contacts on the source/drain regions.

Specifically, the memory structure 200 includes a substrate 210 with a digit region 202 and a cell region 204, a fin 220a on the substrate 210 in the digit region 202, and a fin 220b on the substrate 210 in the cell region 204. A first source/drain region 224a is positioned on a bottom portion 222a of the fin 220a, and a second source/drain region 224b is positioned on a bottom portion 222b of the fin 220b. A first dielectric layer 230 covers the fin 220a, the fin 220b, and the substrate 210, so that the first source/drain region 224a and the second source/drain region 224b are covered by the first dielectric layer 230. An isolation structure 240 is positioned adjacent to the cell region 204 to separate the cell region 204 from another memory cell (not shown). A gate structure 250 is positioned above the substrate 210, while the first dielectric layer 230 covering the first source/drain region 224a and second source/drain region 224b is above the gate structure 250. A second dielectric layer 260 is positioned on the gate structure 250 and covers the first dielectric layer 230 covering the first source/drain region 224a and second source/drain region 224b. In some embodiments, the first dielectric layer 230 may include a material different from that of the second dielectric layer 260. For example, the first dielectric layer 230 may be an oxide layer, while the second dielectric layer 260 may be a nitride layer.

A first contact 270 of the memory structure 200, or referred as a digit contact, contacts the first source/drain region 224a through the first dielectric layer 230. Specifically, the first contact 270 includes a first contact portion 270a, a second contact portion 270b adjacent to the first contact portion 270a, and a third contact portion 270c adjacent to the second contact portion 270b. In other words, the second contact portion 270b is between the first contact portion 270a and the third contact portion 270c.

The first contact portion 270a extends into the first source/drain region 224a, so that a bottom surface of the first contact portion 270a is lower than a top surface of the first source/drain region 224a. The second contact portion 270b extends into the first dielectric layer 230 on a sidewall of the first source/drain region 224a. A bottom surface of the second contact portion 270b is also lower than the top surface of the first source/drain region 224a. The third contact portion 270c extends into the second dielectric layer 260.

As shown in FIG. 2B, a sidewall of the first contact portion 270a is separated from a sidewall, which does not contact the first contact 270, of the first source/drain region 224a by a distance D1. More specifically, the distance D1 between the sidewall of the first contact portion 270a and the sidewall of the first source/drain region 224a is 30% to 60% of a width W1 of the first source/drain region 224a. As a result, not only the bottom surface but also the sidewall of the first contact portion 270a contacts the first source/drain region 224a.

Compared to the memory structure 100 in FIG. 1, the contact area between the first contact 270 and the first source/drain region 224a is greater than the contact area between the first contact 170 and the first source/drain region 124a in FIG. 1. Therefore, the electric resistance between the first contact 270 and the first source/drain region 224a is reduced. This increases the current flow between the first source/drain region 224a and the second source/drain region 224b, which improves the efficiency of the memory structure 200. In addition, the design of the first contact 270 does not affect the relationship between the first source/drain region 224a and the gate structure 250. This prevents the memory structure 200 from increasing its gate-induced drain leakage (GIDL).

A second contact 280 of the memory structure 200, or referred as a cell contact, contacts the second source/drain region 224b through the first dielectric layer 230. The second contact 280 includes a first contact portion 280a, a third contact portion 280c, and a second contact portion 280b between the first contact portion 280a and third contact portion 280c.

The first contact portion 280a extends into the second source/drain region 224b, so that a bottom surface of the first contact portion 280a is lower than a top surface of the second source/drain region 224b. The second contact portion 280b extends into the first dielectric layer 230 on a sidewall of the second source/drain region 224b. Compared to the second contact portion 270b, the second contact portion 280b further extends laterally into the second source/drain region 224b. The third contact portion 280c extends into the second dielectric layer 260.

Similar to the first contact 270, a sidewall of the first contact portion 280a is separated from a sidewall, which does not contact the second contact 280, of the second source/drain region 224b by a distance. The distance between the sidewall of the first contact portion 280a and the sidewall of the second source/drain region 224b is 30% to 60% of a width of the second source/drain region 224b. As a result, not only the bottom surface but also the sidewall of the first contact portion 280a contacts the second source/drain region 224b. Moreover, the second contact portion 280b extends into the second source/drain region 224b so that the bottom surface and the sidewall of the second contact portion 280b also contact the second source/drain region 224b.

Compared to the memory structure 100 in FIG. 1, the contact area between the second contact 280 and the second source/drain region 224b is greater than the contact area between the second contact 180 and the second source/drain region 124b in FIG. 1. Therefore, the electric resistance between the second contact 280 and the second source/drain region 224b is reduced, which improves the efficiency of the memory structure 200.

Referring to FIGS. 2A and 2B, the position of the bottom surface of each contact portion may be appropriately arranged to increase the contact area between the contact and the source/drain region. In some embodiments, a bottom surface of the third contact portion may be higher than the bottom surface of the first contact portion and the bottom surface of the second contact portion. As shown in FIG. 2B, while the bottom surface of the first contact portion 270a and the bottom surface of the second contact portion 270b are lower than the top surface of the first source/drain region 224a, the bottom surface of the third contact portion 270c may be coplanar with the top surface of the first source/drain region 224a. Similarly, while the bottom surface of the first contact portion 280a and the bottom surface of the second contact portion 280b are lower than the top surface of the second source/drain region 224b, the bottom surface of the third contact portion 280c may be coplanar with the top surface of the second source/drain region 224b.

In some embodiments, the bottom surface of the second contact portion may be coplanar with the bottom surface of the first contact portion. As shown in FIG. 2B, a distance H1 from the top surface of the first source/drain region 224a to the bottom surface of the second contact portion 270b may be the same as a distance H2 from the top surface of the first source/drain region 224a to the bottom surface of the first contact portion 270a. As a result, the bottom surface of the second contact portion 270b is coplanar with the bottom surface of the first contact portion 270a. In some embodiments, the distance H1 may be in a range of 10 nm to 20 nm. If the distance H1 is smaller than 10 nm, the contact area between the first contact 270 and the first source/drain region 224a may not be significantly increased. If the distance H1 is larger than 20 nm, the GIDL of the memory structure 200 may be degraded.

In some embodiments, the bottom surface of the second contact portion may be lower than the bottom surface of the first contact portion. As shown in FIG. 2B, a distance H3 from the top surface of the second source/drain region 224b to the bottom surface of the second contact portion 280b may be larger than a distance H4 from the top surface of the second source/drain region 224b to the bottom surface of the first contact portion 280a. As a result, the bottom surface of the second contact portion 280b is lower than the bottom surface of the first contact portion 280a. In some embodiments, the distance H3 may be in a range of 10 nm to 20 nm. If the distance H3 is smaller than 10 nm, the contact area between the second contact 280 and the second source/drain region 224b may not be significantly increased. If the distance H1 is larger than 20 nm, the GIDL of the memory structure 200 may be degraded.

In some embodiments, the position of the bottom surface of the digit contact may correspond to that of the bottom surface of the cell contact due to the manufacturing process of the memory structure. For example, as shown in FIG. 2B, the distance H1 from the top surface of the first source/drain region 224a to the bottom surface of the second contact portion 270b may be the same as the distance H3 from the top surface of the second source/drain region 224b to the bottom surface of the second contact portion 280b. As a result, the bottom surface of the second contact portion 270b is coplanar with the bottom surface of the second contact portion 280b.

The distance H2 from the top surface of the first source/drain region 224a to the bottom surface of the first contact portion 270a may be larger than the distance H4 from the top surface of the second source/drain region 224b to the bottom surface of the first contact portion 280a. As a result, the bottom surface of the first contact portion 270a is lower than the bottom surface of the first contact portion 280a. It should be noted that the bottom surface of the third contact portion 270c, the bottom surface of the third contact portion 280c, the top surface of the first source/drain region 224a, and the top surface of the second source/drain region 224b may be coplanar with each other.

Figure 3A:
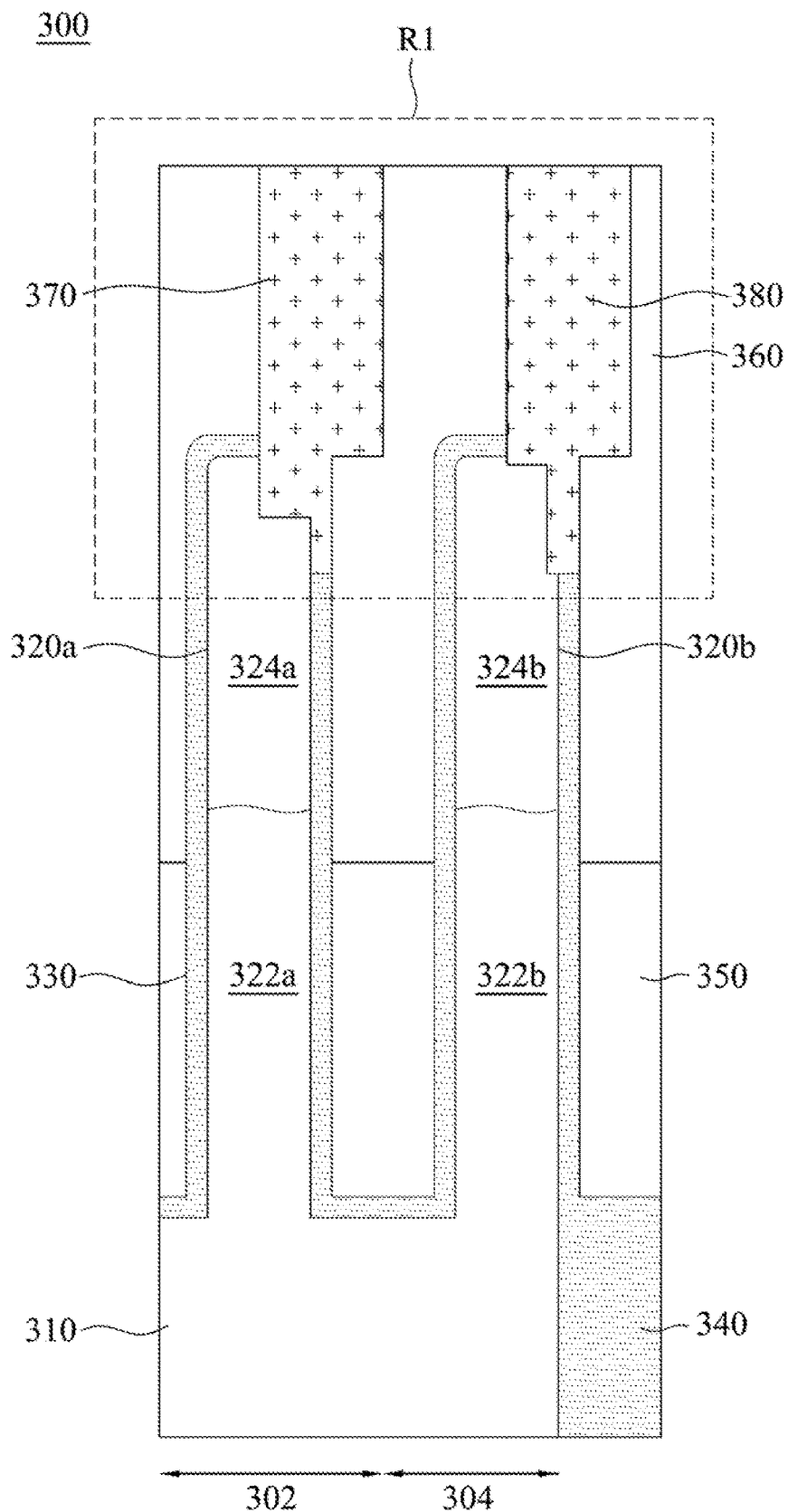
FIG. 3A illustrates a cross-sectional view of a memory structure according to another embodiment of the present disclosure.
Figure 3B:
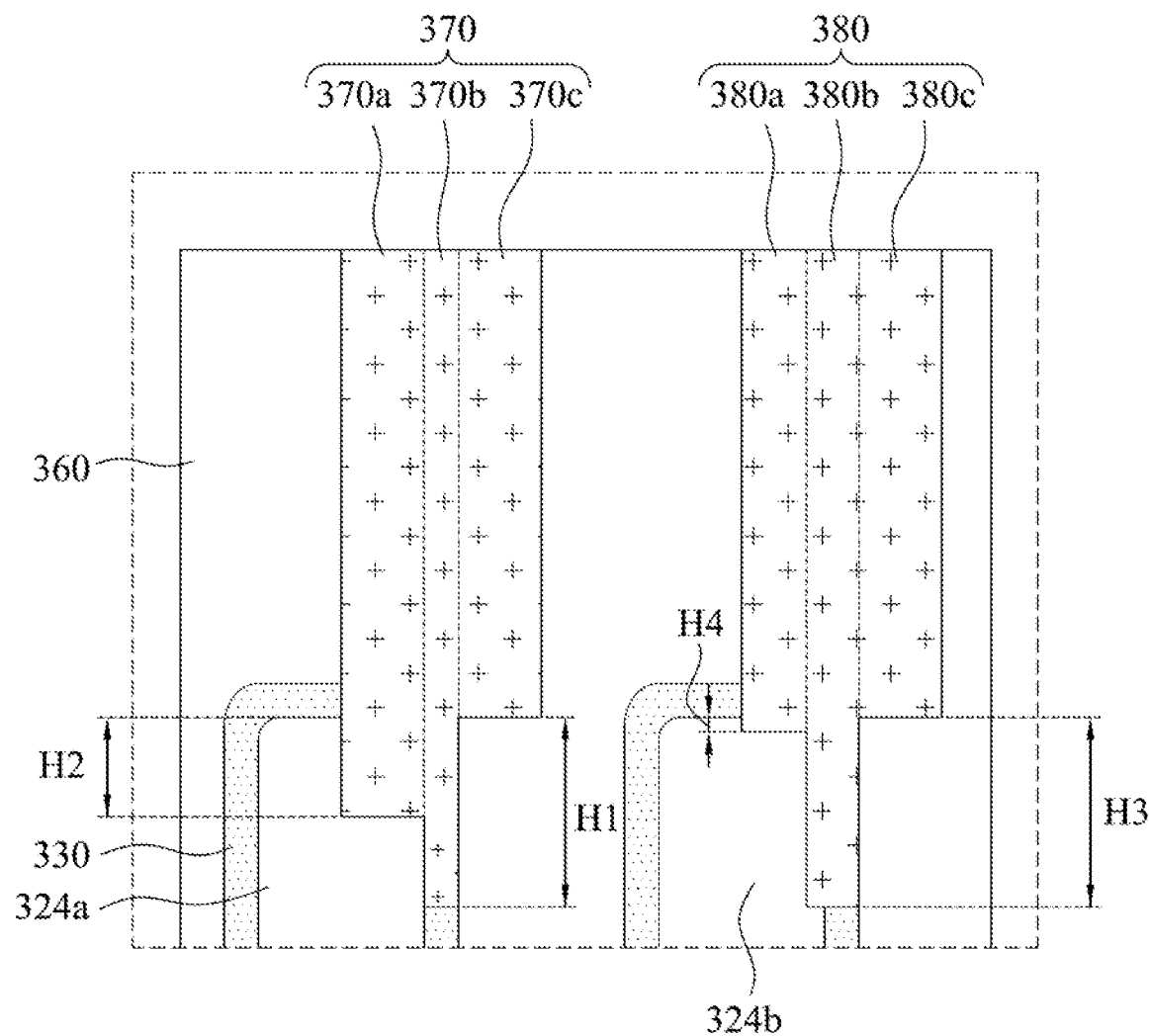
FIG. 3B illustrates an enlarged view of the memory structure shown in FIG. 3A.

FIG. 3A illustrates a cross-sectional view of a memory structure 300 according to another embodiment of the present disclosure. FIG. 3B illustrates an enlarged view of a region R1 of the memory structure 300 shown in FIG. 3A. Most components, such as the substrate 310 having the digit region 302 and the cell region 304, the fin 320a having the bottom portion 322a, the fin 320b having the bottom portion 322b, the first dielectric layer 330, the isolation structure 340, the gate structure 350, and the second dielectric layer 360, of the memory structure 300 are similar to those corresponding components of the memory structure 200 shown in FIGS. 2A and 2B, except for the design of the contact portions of the first contact 370 and the second contact 380. The details of those similar components may refer to the description related to the memory structure 200 and are not repeated herein for simplicity.

As shown in FIG. 3B, the distance H1 from the top surface of the first source/drain region 324a to the bottom surface of the second contact portion 370b may be the same as the distance H3 from the top surface of the second source/drain region 324b to the bottom surface of the second contact portion 380b. The distance H2 from the top surface of the first source/drain region 324a to the bottom surface of the first contact portion 370a may be larger than the distance H4 from the top surface of the second source/drain region 324b to the bottom surface of the first contact portion 380a. In other words, the bottom surface of the first contact portion 370a is lower than the bottom surface of the first contact portion 380a. The bottom surface of the third contact portion 370c, the bottom surface of the third contact portion 380c, the top surface of the first source/drain region 324a, and the top surface of the second source/drain region 324b may be coplanar with each other.

Compared to the memory structure 200 shown in FIG. 2B, the memory structure 300 may have the distance H1 larger than the distance H2 and the distance H3 larger than the distance H4. As a result, both bottom surfaces of the second contact portion 370b and the second contact portion 380b are lower than the bottom surfaces of the first contact portion 370a and the first contact portion 380a. Therefore, not only the first contact portion 370a but also the second contact portion 370b contacts the first source/drain region 324a to increase the contact area and reduce the resistance between the first contact 370 and the first source/drain region 324a. Similarly, both the first contact portion 380a and the second contact portion 380b contacts the second source/drain region 324b to increase the contact area and reduce the resistance between the second contact 380 and the second source/drain region 324b.

Referring back to FIGS. 2A and 2B, in some embodiments, the width of each contact portion may be appropriately arranged to increase the contact area between the contact and the source/drain region. For example, an interface between the first contact portion 270a and the second contact portion 270b may be coplanar with the sidewall of the first source/drain region 224a, and an interface between the second contact portion 270b and the third contact portion 270c may be coplanar with the sidewall of the first dielectric layer 230 on the sidewall of the first source/drain region 224a. As a result, a width of the second contact portion 270b is the same as a width of the first dielectric layer 230 on the sidewall of the first source/drain region 224a.

As another example, an interface between the second contact portion 280b and the third contact portion 280c may be coplanar with the sidewall of the first dielectric layer 230 on the sidewall of the second source/drain region 224b, while the second contact portion 280b laterally extends toward the second source/drain region 224b. As a result, a width of the second contact portion 280b is larger than a width of the first dielectric layer 230 on the sidewall of the second source/drain region 224b. In some embodiments which the first contact 270 is a digit contact and the second contact 280 is a cell contact, the width of the second contact portion 280b may be larger than the width of the second contact portion 270b.

In some embodiments, the third contact portion may have the suitable width to prevent the conductive path between the first contact and the second source/drain region. For example, the sidewall of the first dielectric layer 230 on the sidewall of the first source/drain region 224a and the nearer sidewall of the first dielectric layer 230 on the sidewall of the second source/drain region 224b is separated by a distance D2. A width W2 of the third contact portion 270c may be 30% to 60% of the distance D2 to prevent the current directly flowing between the first contact 270 and the second source/drain region 224b. In some embodiments, the width of the third contact portion 270c may be the same as the third contact portion 280c.

According to some embodiments of the present disclosure, FIGS. 4A to 4H illustrate cross-sectional views of intermediate stages of a manufacturing method of the memory structure 200 shown in FIGS. 2A to 2B. More specifically, the manufacturing method relates to the formation of the contacts on the source/drain regions. FIGS. 4A to 4H illustrate the cross-sectional views of manufacturing the memory structure 200 for illustration; however, the method shown by FIGS. 4A to 4H may not be limited to the memory structure 200. The method may be used to manufacture other memory structures in the scope of the present disclosure, such as the memory structure 300 shown in FIG. 3B. Moreover, additional manufacturing operations may be performed between various operations of the method and may be omitted merely for clarity and ease of description. Additional operations may be provided before, during, and/or after the presented method.

Figure 4A:
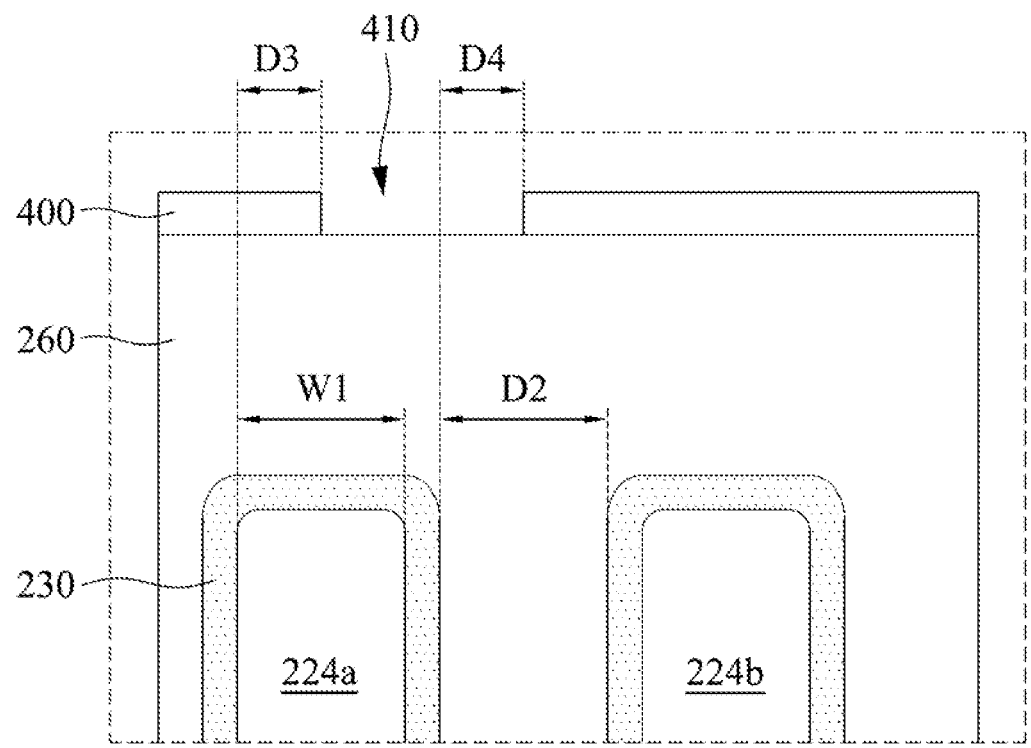
FIGS. 4A to 4H illustrate cross-sectional views of intermediate stages of a manufacturing method of the memory structure according to some embodiments of the present disclosure.

Referring to FIG. 4A, the first source/drain region 224a and the second source/drain region 224b are provided. The first dielectric layer 230 is formed on the first source/drain region 224a and the second source/drain region 224b so that the top surfaces and the sidewalls of the first source/drain region 224a and the second source/drain region 224b are covered by the first dielectric layer 230. The second dielectric layer 260 is formed on the first dielectric layer 230. As shown in FIG. 4A, the top surface and the sidewalls of the first dielectric layer 230 may be covered by the second dielectric layer 260.

A mask layer 400 is formed on the second dielectric layer 260. The mask layer 400 includes a mask opening 410 exposing a portion of the second dielectric layer 260. The mask opening 410 is positioned above the first source/drain region 224a. As shown in FIG. 4A, the mask opening 410 is not aligned with the first source/drain region 224a. Specifically, the sidewall of the mask opening 410 directly above the first source/drain region 224a and the sidewall of the first source/drain region 224a is separated by a distance D3. In some embodiments, the distance D3 may be 30% to 60% of the width W1 of the first source/drain region 224a.

The other sidewall of the mask opening 410 is directly above the second dielectric layer 260 between the first source/drain region 224a and the second source/drain region 224b. The mentioned other sidewall of the mask opening 410 and the sidewall of the first dielectric layer 230 on the first source/drain region 224a is separated by a distance D4. In some embodiments, the distance D4 may be 30% to 60% of the distance D2 between the first dielectric layer 230 on the sidewall of the first source/drain region 224a and the first dielectric layer 230 on the nearer sidewall of the second source/drain region 224b.

Figure 4B:
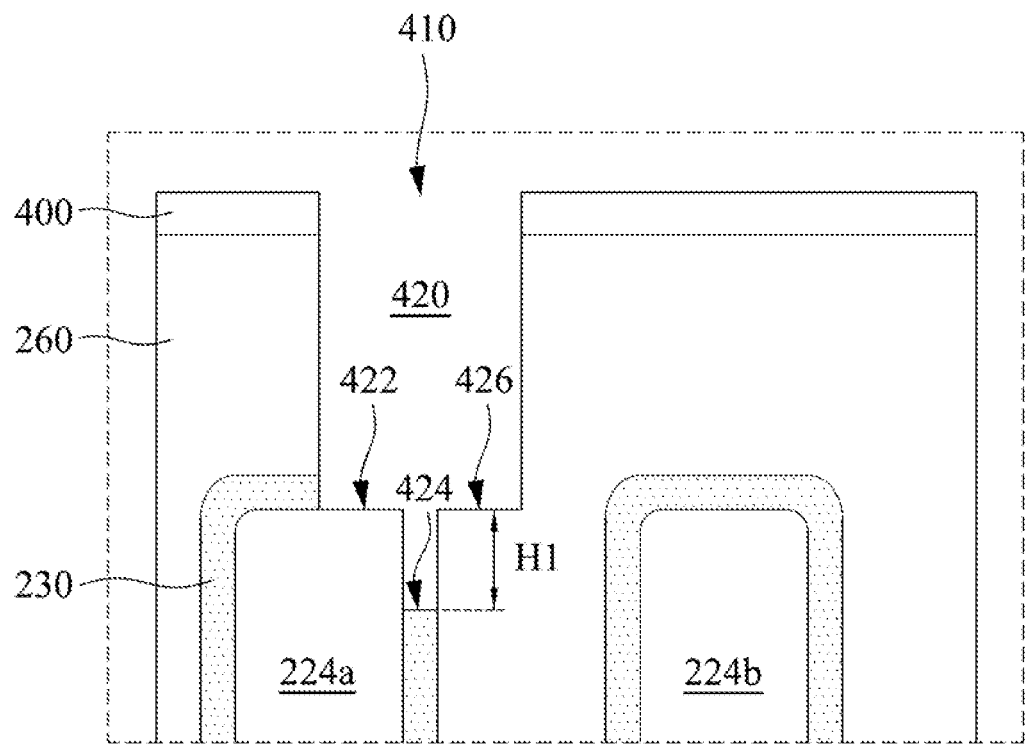

Referring to FIG. 4B, the second dielectric layer 260 exposed by the mask opening 410 and the underlying first dielectric layer 230 are etched to form the opening 420. Specifically, an etching operation is performed through the mask opening 410. The etching operation is stopped on the top surface of the first source/drain region 224a. When the etching operation is stopped, the top surface and one sidewall of the first source/drain region 224a are exposed by the opening 420.

The bottom surface of the opening 420 includes a first portion 422 exposing the top surface of the first source/drain region 224a, a second portion 424 exposing the first dielectric layer 230 on the sidewall of the first source/drain region 224a, and a third portion 426 exposing the second dielectric layer 260. The second portion 424 is between the first portion 422 and the third portion 426. As shown in FIG. 4B, the second portion 424 is lower than the first portion 422 and the third portion 426, so that the sidewall of the first source/drain region 224a is exposed by the opening 420. In some embodiments, the first portion 422 may be coplanar with the third portion 426, and a distance H1 between the top surface of the first source/drain region 224a and the second portion 424 may be in a range of 10 nm to 20 nm.

In some embodiments, the etching operation performed on the second dielectric layer 260 and the first dielectric layer 230 may be an anisotropic etching process. In some embodiments, the etching operation performed on the second dielectric layer 260 and the first dielectric layer 230 may have higher selectivity to the first dielectric layer 230. Therefore, the first dielectric layer 230 on the sidewall of the first source/drain region 224a may be etched in a faster rate than that of the second dielectric layer 260 to form the second portion 424 lower than the third portion 426.

Figure 4C:
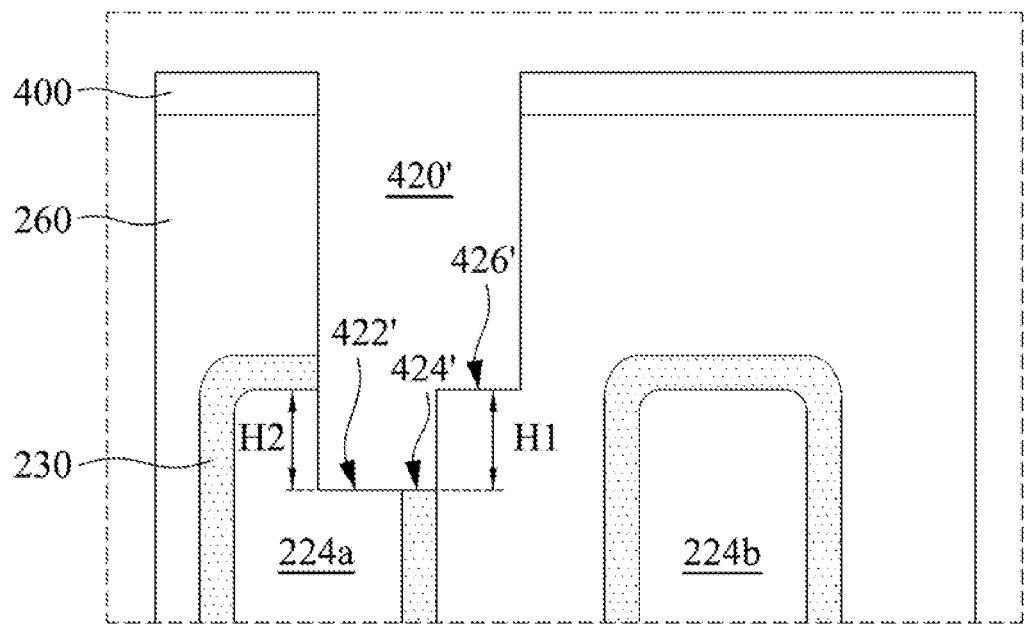

Referring to FIG. 4C, the first source/drain region 224a exposed by the opening 420 is etched to form the opening 420'. Specifically, an etching operation is performed through the opening 420. The etching operation is selective to the first source/drain region 224a so that the first dielectric layer 230 and the second dielectric layer 260 are not significantly etched. As a result, the first source/drain region 224a is etched downward from the exposed portion of the top surface and etched laterally from the exposed portion of the sidewall to form the opening 420'.

The bottom surface of the opening 420' includes the first portion 422' exposing the first source/drain region 224a, the second portion 424' exposing the first dielectric layer 230, and the third portion 426' exposing the second dielectric layer 260. In some embodiments, as shown in FIG. 4B, the second portion 424' may be coplanar with the first portion 422', and the second portion 424' may be lower than the third portion 426'. In other words, a distance H2 between the top surface of the first source/drain region 224a and the first portion 422' may be the same as the distance H1 which is in a range of 10 nm to 20 nm. In some other embodiments, the second portion 424' may be lower than the first portion 422', and the first portion 422' may be lower than the third portion 426'.

Figure 4D:
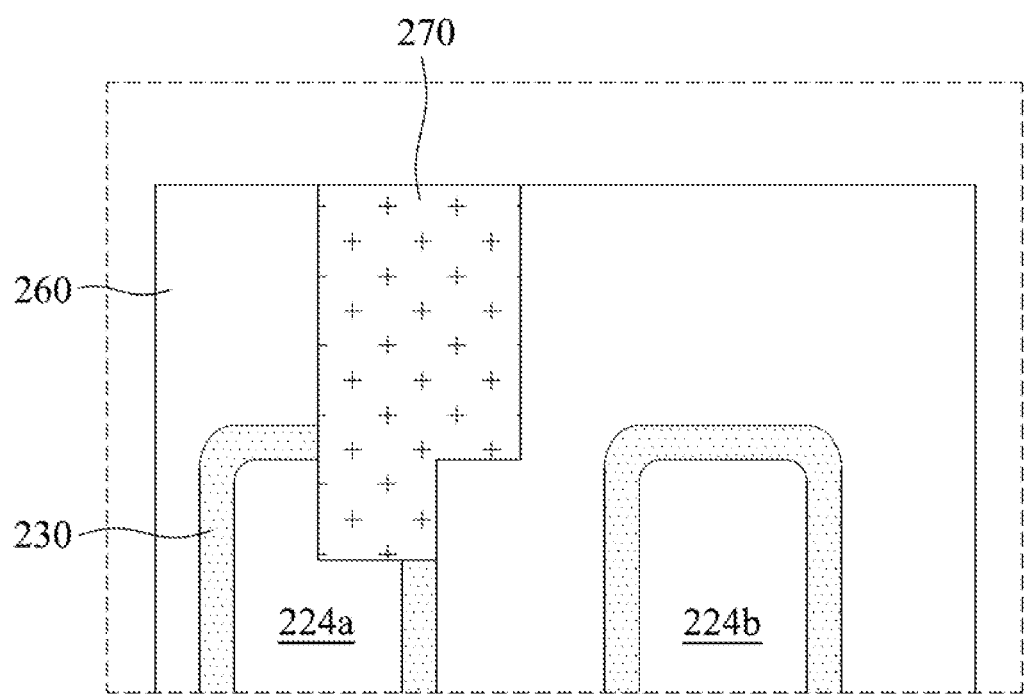

Referring to FIG. 4D, the opening 420' in FIG. 4C is filled with a conductive material to form the first contact 270. Specifically, a conductive material layer is formed in the opening 420' and on the second dielectric layer 260. Then, a planarization process is performed on the conductive material layer to remove the excessive conductive material on the second dielectric layer 260. The remained conductive material forms the first contact 270. The first contact 270 corresponds to the first contact 270 shown in FIG. 2B, where the contact area between the first contact 270 and the first source/drain region 224a is increased.

Figure 4E:
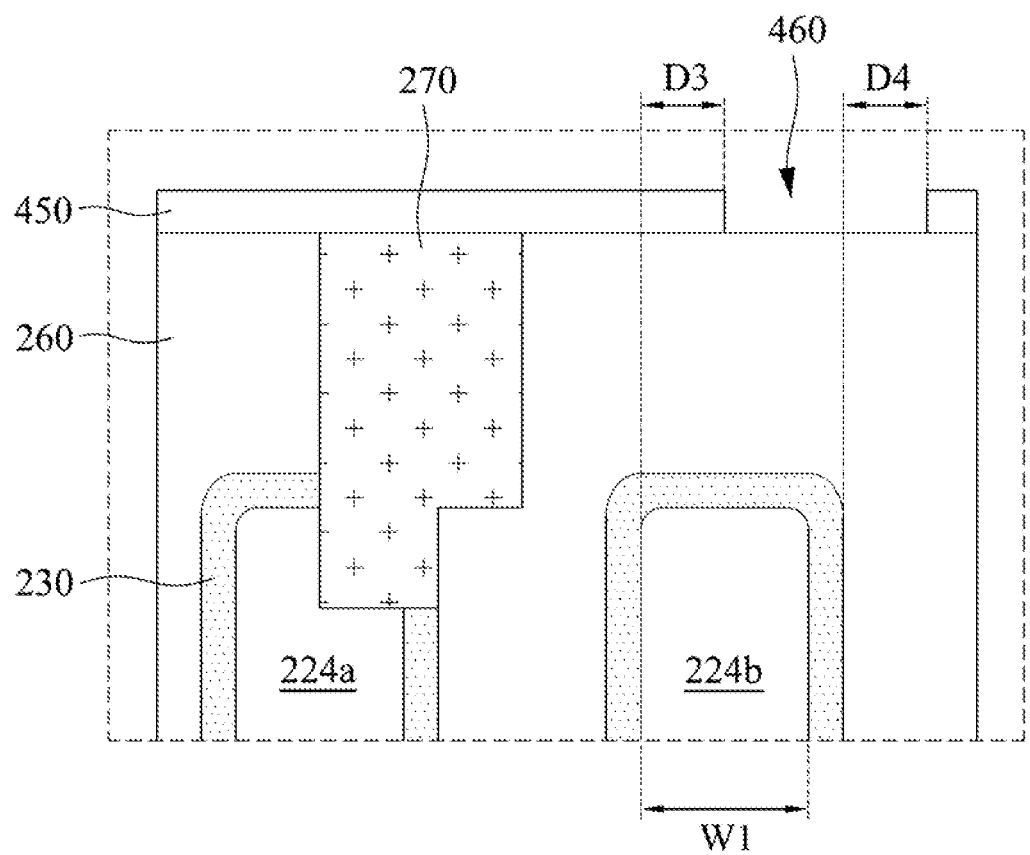
Figure 4F:
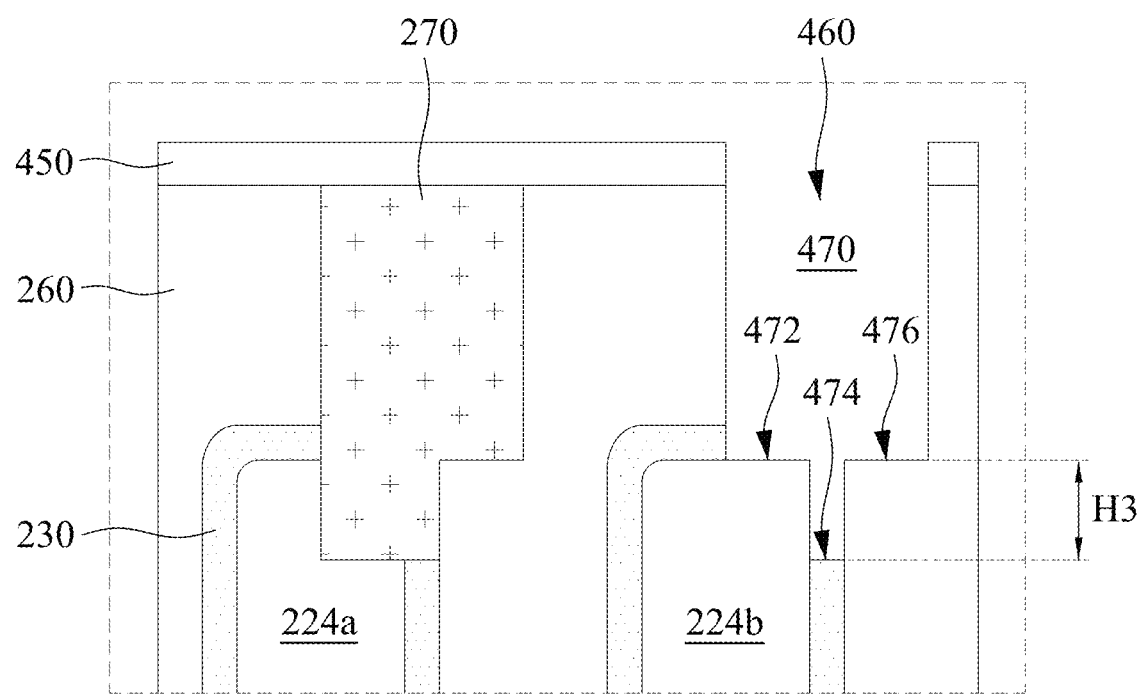

The above mentioned operations may also be used to form the second contact 280. Referring to FIGS. 4E to 4F, a mask layer 450 including a mask opening 460 is formed on the second dielectric layer 260. The mask opening 460 is positioned above the second source/drain region 224b. The second dielectric layer 260 exposed by the mask opening 460 and the underlying first dielectric layer 230 are etched to form the opening 470. The opening 470 is similar to the opening 420 shown in FIG. 4B, in which the opening 470 includes a first portion 472 exposing the second source/drain region 224b, a second portion 474 exposing the first dielectric layer 230 on the sidewall of the second source/drain region 224b, and a third portion 476 exposing the second dielectric layer 260. The details of the operations shown in FIG. 4E to 4F are similar to the description related to FIGS. 4A to 4B and are not repeated herein for simplicity.

In some embodiments, a distance D3 between the sidewall of the mask opening 460 directly above the second source/drain region 224b and the sidewall of the second source/drain region 224b may be 30% to 60% of the width W1 of the second source/drain region 224b. In some embodiments, a distance between the other sidewall of the mask opening 460 and the sidewall of the first dielectric layer 230 on the second source/drain region 224b may be the distance D4 shown in FIG. 4A. In some embodiments, a distance H3 between the top surface of the second source/drain region 224b and the second portion 474 may be in a range of 10 nm to 20 nm.

Figure 4G:
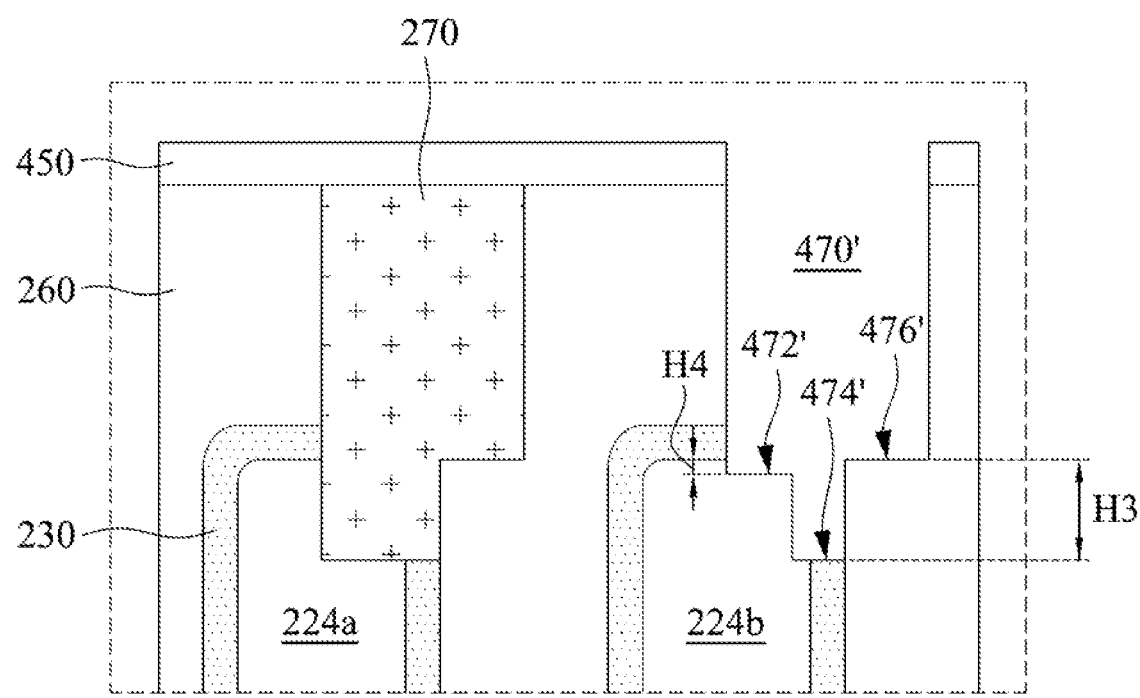

Referring to FIG. 4G, the second source/drain region 224b exposed by the opening 470 is etched to form the opening 470'. Specifically, an etching operation is performed through the opening 470. The etching operation is selective to the second source/drain region 224b so that the first dielectric layer 230 and the second dielectric layer 260 are not significantly etched. As a result, the second source/drain region 224b is etched downward from the exposed portion of the top surface and etched laterally from the exposed portion of the sidewall to form the opening 470'.

The bottom surface of the opening 470' includes the first portion 472' exposing the second source/drain region 224b, the second portion 474' exposing the first dielectric layer 230, and the third portion 476' exposing the second dielectric layer 260. In some embodiments, compared to the first source/drain region 224a in FIG. 4C, the second source/drain region 224b may be etched less. As a result, the second portion 474' is lower than the first portion 472', and the first portion 472' is lower than the third portion 476'. In other words, a distance H4 between the top surface of the second source/drain region 224b and the first portion 472' may be smaller than the distance H3. In some embodiments, the width of the second portion 474' may be larger than that of the second portion 424' in FIG. 4C so that the second portion 474' also exposes a portion of the second source/drain region 224b.

Figure 4H:
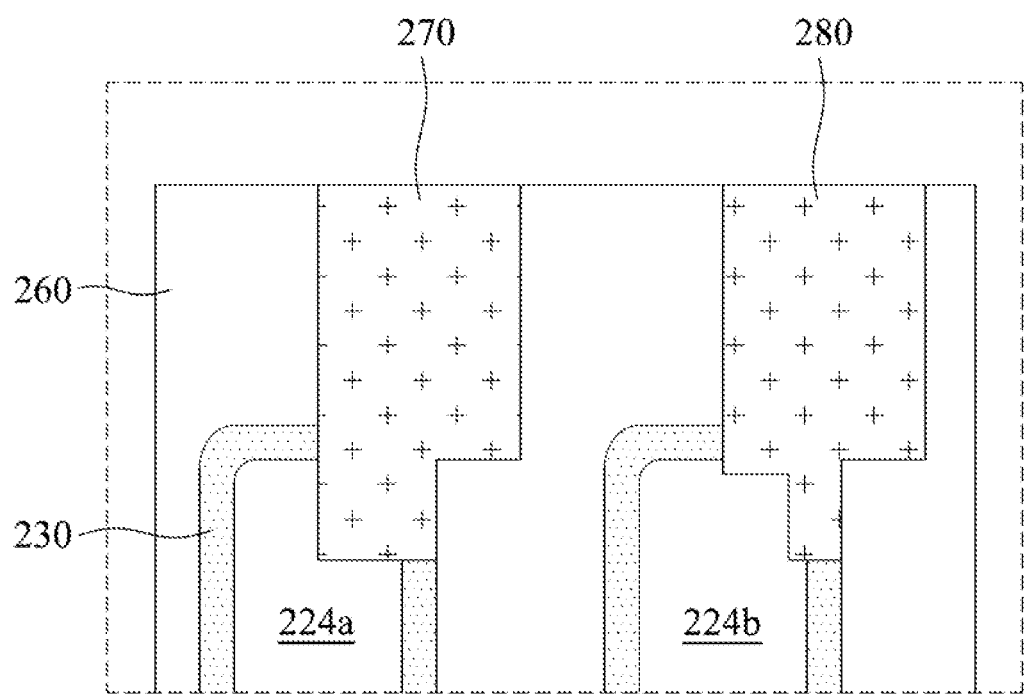

Referring to FIG. 4H, the opening 470' in FIG. 4G is filled with a conductive material to form the second contact 280. The operations shown in FIG. 4H are similar to the description related to FIG. 4D. The formed second contact 280 corresponds to the second contact 280 shown in FIG. 2B, where the contact area between the second contact 280 and the second source/drain region 224b is increased.

According to the mentioned embodiments of the present disclosure, the memory structure includes a first dielectric layer covering a source/drain region, a second dielectric layer on the first dielectric layer, and a contact contacting the source/drain region. The contact includes a first contact portion extending into the source/drain region, a second contact portion extending into the first dielectric layer, and a third contact portion extending into the second dielectric layer. The distance between a sidewall of the first contact portion and a sidewall of the source/drain region is 30% to 60% of the width of the source/drain region. In addition, the positions of the bottom surfaces of the contact portions may be controlled by the manufacturing method. As a result, the bottom surface of the first contact portion, the sidewall of the first contact portion, and even the sidewall of the second contact portion contacts the source/drain region. Therefore, the contact area between the contact and the source/drain region is increased to reduce the contact electric resistance, which improves the efficiency of the memory structure.

Although the present disclosure has been described in considerable detail with reference to certain embodiments thereof, other embodiments are possible. Therefore, the spirit and scope of the appended claims should not be limited to the description of the embodiments contained herein. It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A memory structure, comprising:
   a source/drain region on a substrate;
   a first dielectric layer covering the source/drain region;
   a second dielectric layer on the first dielectric layer; and
   a contact contacting the source/drain region, wherein the contact comprises:
   a first contact portion extending into the source/drain region, wherein a bottom surface of the first contact portion is lower than a top surface of the source/drain region, and the bottom surface of the first contact portion physically contacts the source/drain region;
   a second contact portion extending into the first dielectric layer, wherein a bottom surface of the second contact portion physically contacts the first dielectric layer; and
   a third contact portion extending into the second dielectric layer, wherein a bottom surface of the third contact portion physically contacts the second dielectric layer, the second contact portion is between the first contact portion and the third contact portion, and a distance between a sidewall of the first contact portion and a sidewall of the source/drain region is 30% to 60% of a width of the source/drain region.

2. The memory structure of claim 1, wherein the bottom surface of the second contact portion is lower than the bottom surface of the first contact portion.

3. The memory structure of claim 1, wherein the bottom surface of the second contact portion is coplanar with the bottom surface of the first contact portion.

4. The memory structure of claim 1, wherein the bottom surface of the third contact portion is higher than the bottom surface of the first contact portion and the bottom surface of the second contact portion.

5. The memory structure of claim 1, wherein the bottom surface of the third contact portion is coplanar with the top surface of the source/drain region.

6. The memory structure of claim 1, wherein an interface between the second contact portion and the third contact portion is coplanar with a sidewall of the first dielectric layer.

7. The memory structure of claim 6, wherein a width of the second contact portion is the same as a width of the first dielectric layer on the sidewall of the source/drain region.

8. The memory structure of claim 6, wherein a width of the second contact portion is larger than a width of the first dielectric layer on the sidewall of the source/drain region.

9. The memory structure of claim 1, wherein the first dielectric layer is an oxide layer, and the second dielectric layer is a nitride layer.

10. A memory structure, comprising:
- a substrate comprising a digit region and a cell region;
- a first source/drain region on the substrate in the digit region;
- a second source/drain region on the substrate in the cell region;
- a first dielectric layer covering the first source/drain region and the second source/drain region;
- a second dielectric layer on the first dielectric layer;
- a digit contact contacting the first source/drain region, wherein the digit contact comprises:
  - a first digit contact portion extending into the first source/drain region, wherein a bottom surface of the first digit contact portion is lower than a top surface of the first source/drain region, and the bottom surface of the first digit contact portion physically contacts the first source/drain region;
  - a second digit contact portion extending into the first dielectric layer on a sidewall of the first source/drain region, wherein a bottom surface of the second digit contact portion physically contacts the first dielectric layer; and
  - a third digit contact portion extending into the second dielectric layer, wherein a bottom surface of the third digit contact portion physically contacts the second dielectric layer, the second digit contact portion is between the first digit contact portion and the third digit contact portion, and a distance between a sidewall of the first digit contact portion and another sidewall of the first source/drain region is 30% to 60% of a width of the first source/drain region; and
- a cell contact contacting the second source/drain region.

11. The memory structure of claim 10, wherein the cell contact comprises:
- a first cell contact portion extending into the second source/drain region, wherein a bottom surface of the first cell contact portion is lower than a top surface of the second source/drain region, and the bottom surface of the first cell contact portion physically contacts the second source/drain region;
- a second cell contact portion extending into the first dielectric layer on a sidewall of the second source/drain region and the second source/drain region, wherein a bottom surface of the second cell contact portion physically contacts the first dielectric layer; and
- a third cell contact portion extending into the second dielectric layer, wherein a bottom surface of the third cell contact portion physically contacts the second dielectric layer, the second cell contact portion is between the first cell contact portion and the third cell contact portion, and a distance between a sidewall of the first cell contact portion and another sidewall of the second source/drain region is 30% to 60% of a width of the second source/drain region.

12. The memory structure of claim 11, wherein the bottom surface of the first digit contact portion is lower than the bottom surface of the first cell contact portion.

13. The memory structure of claim 11, wherein the bottom surface of the second digit contact portion is coplanar with the bottom surface of the second cell contact portion.

14. The memory structure of claim 11, wherein the bottom surface of the third digit contact portion is coplanar with the bottom surface of the third cell contact portion and the top surface of the first source/drain region.

15. The memory structure of claim 11, wherein a width of the third digit contact portion is 30% to 60% of a distance between the first dielectric layer on the sidewall of the first source/drain region and the first dielectric layer on the sidewall of the second source/drain region.

16. The memory structure of claim 11, wherein a width of the second cell contact portion is larger than a width of the second digit contact portion.

* * * * *